United States Patent
Li et al.

(10) Patent No.: US 11,264,588 B2
(45) Date of Patent: Mar. 1, 2022

(54) METAL ENCAPSULATION STRUCTURE AND PRODUCTION METHOD, DISPLAY PANEL AND ENCAPSULATION METHOD THEREOF, AND DISPLAY DEVICE

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Jiewei Li, Beijing (CN); Chuan Yin, Beijing (CN); Xianjiang Xiong, Beijing (CN); Zhongsheng Qi, Beijing (CN); Litao Qu, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 450 days.

(21) Appl. No.: 16/338,299

(22) PCT Filed: Aug. 3, 2018

(86) PCT No.: PCT/CN2018/098565
§ 371 (c)(1),
(2) Date: Mar. 29, 2019

(87) PCT Pub. No.: WO2019/080581
PCT Pub. Date: May 2, 2019

(65) Prior Publication Data
US 2021/0328176 A1    Oct. 21, 2021

(30) Foreign Application Priority Data
Oct. 24, 2017   (CN) .......................... 201711004076.1

(51) Int. Cl.
*H01L 51/52* (2006.01)
*H01L 51/56* (2006.01)

(52) U.S. Cl.
CPC .......... *H01L 51/5243* (2013.01); *H01L 51/56* (2013.01)

(58) Field of Classification Search
None
See application file for complete search history.

(56) References Cited

U.S. PATENT DOCUMENTS

2002/0020992 A1*  2/2002  Kanuma ............... B60R 21/235
                                                           280/730.2
2013/0016047 A1*  1/2013  Masumoto ........... G06F 3/0445
                                                           345/173
(Continued)

FOREIGN PATENT DOCUMENTS

CN          102230203 A      11/2011
CN          104835920 A       8/2015
(Continued)

OTHER PUBLICATIONS

International Search Report and English Translation of Box V of the Written Opinion dated Nov. 8, 2018, received for corresponding PCT Application No. PCT/CN2018/098565.
(Continued)

*Primary Examiner* — Dung A. Le
(74) *Attorney, Agent, or Firm* — Kinney & Lange, P.A.

(57) ABSTRACT

There is provided a metal encapsulation structure and a production method thereof, an encapsulation method for a display panel, and a display device. This production method comprises steps of: providing a metal film having a first surface and a second surface opposite to the first surface; forming a silane film on the first surface of the metal film, wherein a surface of the silane film away from the metal film has an active group; and attaching the first surface formed
(Continued)

with the silane film to an adhesive layer, so as to react and bond the active group and the adhesive layer.

17 Claims, 3 Drawing Sheets

(56) References Cited

U.S. PATENT DOCUMENTS

| | | |
|---|---|---|
| 2016/0093830 A1 | 3/2016 | Yoo et al. |
| 2017/0120561 A1* | 5/2017 | Huang .................... B32B 27/32 |
| 2017/0155086 A1 | 6/2017 | Kang |
| 2017/0179428 A1 | 6/2017 | Li et al. |
| 2018/0138410 A1* | 5/2018 | Fujito ........................ C23F 1/28 |
| 2019/0187841 A1* | 6/2019 | Kuwabara ................. C25F 3/16 |

FOREIGN PATENT DOCUMENTS

| | | |
|---|---|---|
| CN | 105247699 A | 1/2016 |
| CN | 106816548 A | 6/2017 |
| CN | 107785503 A | 3/2018 |

OTHER PUBLICATIONS

Zhang Jian-fei, Wang Jin-zhong, Li Bin, Fan Yong-ning, Zhang Quan-wei, Ma Yan-qing, Discussion on Influence of Adhesion of Epoxy Coatings on Metal, Experimental Research and Application, 1007-9548 (2018) 02-0001-04, China Academic Journal Electronic Publishing House, 5 pages, Feb. 2018, China.

\* cited by examiner

S1: Providing a metal film having a first surface and a second surface opposite to the first surface S2: Forming a silane film on the first surface of the metal film, wherein a surface of the silane film away from the metal film has an active group S3: Attaching the first surface formed with the silane film to an adhesive layer, so as to react and bond the active group and the adhesive layer

METAL ENCAPSULATION STRUCTURE AND PRODUCTION METHOD, DISPLAY PANEL AND ENCAPSULATION METHOD THEREOF, AND DISPLAY DEVICE

CROSS-REFERENCE TO RELATED APPLICATION

This application is the national phase of PCT Application No. PCT/CN2018/098565 filed on Aug. 3, 2018, which in turn claims the priority of Chinese Application No. 201711004076.1 filed on Oct. 24, 2017, the entire contents of which are hereby incorporated by reference.

TECHNICAL FIELD

This disclosure relates to the technical field of display, and particularly to a metal encapsulation structure and a production method thereof, a display panel and an encapsulation method thereof, and a display device.

BACKGROUND

The surface encapsulation technique, which belongs to the mainstream encapsulation technique for large-size OLEDs (Organic Light-Emitting Displays) at present, has been widely used in the current production processes. The current process schemes mainly include the following two types.

Metal Encapsulation Process

A metal film and an OLED display panel (or referred to as back panel) are bonded together by using a pre-cured adhesive film, and the adhesive film is then cured by a heat pressing process so as to encapsulate the entire surface of the OLED display panel by the metal film.

Dam & Filler Process

A dam adhesive material (a dam filling adhesive) having a high viscosity is coated at the border portion of a glass encapsulating cover plate. A filler dot matrix is coated in a display region in the dam adhesive by a dispenser. The filler is typically composed of a transparent organic adhesive material such as an epoxy resin, an acrylic resin, and the like and is used to fill the gap between the display region and a region of the dam adhesive material, facilitating the vacuum lamination of the glass encapsulating cover plate and an OLED display panel (or referred to as back panel). The coated filler dot matrix is pre-cured by UV (ultraviolet) and then subjected to vacuum lamination with the OLED display panel (or referred to as back panel), and thermocuring is finally performed to finish the encapsulation process.

Among the two processes described above, the metal encapsulation process is dominant, because the metal film used therein has a better moisture barrier property and it is favorable to the realization of lightening and thinning of displays.

SUMMARY

The embodiments of this disclosure provide a metal encapsulation structure and a production method thereof, a display panel and an encapsulation method thereof, and a display device.

The following technical solutions are used in the embodiments of this disclosure.

In one aspect, an embodiment of this disclosure provides a production method for a metal encapsulation structure, comprising steps of:

providing a metal film having a first surface and a second surface opposite to the first surface;

forming a silane film on the first surface of the metal film, wherein a surface of the silane film away from the metal film has an active group; and attaching the first surface formed with the silane film to an adhesive layer, so as to react and bond the active group and the adhesive layer.

Optionally, the active group is one or more selected from a group consisting of an ethylenically unsaturated group, an amino group, and an epoxy group.

Optionally, the step of forming a silane film on the first surface of the metal film comprises:

forming a silane film on each of the first surface and the second surface of the metal film.

Optionally, the surface of the silane film away from the metal film further comprises a hydrophobic group.

Optionally, the hydrophobic group is one or more selected from a group consisting of an alkyl group having 10-20 carbon atoms, a perfluoroalkyl group having 10-20 carbon atoms, a phenyl group, an acyloxy group, and a polyoxypropylene group.

Optionally, the step of forming a silane film on the first surface of the metal film comprises:

pre-treating the first surface of the metal film to form a hydroxy group on the first surface;

coating a silane hydrolysate on the pre-treated first surface; and drying the first surface to react the silane hydrolysate with the hydroxy group on the first surface to generate the silane film attached to the first surface.

Optionally, the step of forming a silane film on each of the first surface and the second surface of the metal film comprises:

pre-treating each of the first surface and the second surface of the metal film to form a hydroxy group on each of the first surface and the second surface;

impregnating the metal film in a silane hydrolysate to attach the silane hydrolysate to each of the first surface and the second surface of the metal film; and drying each of the first surface and the second surface to react the silane hydrolysate with hydroxy groups on each of the first surface and the second surface to generate silane films attached to the first surface and the second surface.

Optionally, the step of pre-treating the first surface of the metal film to form a hydroxy group on the first surface comprises:

washing the first surface of the metal film to remove residual contaminants;

soaking the metal film in an alkaline solution to form a hydroxy group on the first surface; and withdrawing the metal film and washing the metal film with deionized water to remove the alkaline solution remaining on the first surface.

Optionally, the step of pre-treating each of the first surface and the second surface of the metal film to form a hydroxy group on each of the first surface and the second surface comprises:

washing the first surface and the second surface of the metal film to remove residual contaminants;

soaking the metal film in an alkaline solution to form a hydroxy group on each of the first surface and the second surface; and withdrawing the metal film and washing the metal film with deionized water to remove the alkaline solution remaining on the first surface and the second surface.

Optionally, the silane hydrolysate is formed by hydrolysis of a silane coupling agent.

Optionally, the silane film has a thickness of 1-20 micrometers.

Optionally, the adhesive layer comprises one or more selected from a group consisting of an acrylate and an epoxy resin.

Optionally, the metal film is composed of an iron-nickel alloy.

Optionally, the iron-nickel alloy comprises 35% to 45% of nickel based on the total mass of the iron-nickel alloy.

In another aspect, an embodiment of this disclosure provides a metal encapsulation structure, which is produced by the production method for a metal encapsulation structure of any one described above.

In yet another aspect, an embodiment of this disclosure provides an encapsulation method for a display panel, comprising steps of:

providing a metal film having a first surface and a second surface opposite to the first surface;

forming a silane film on the first surface of the metal film, wherein a surface of the silane film away from the metal film has an active group;

attaching the first surface formed with the silane film to an adhesive layer, so as to react and bond the active group and the adhesive layer, thereby obtaining a metal encapsulation structure; and attaching a side of the adhesive layer in the metal encapsulation structure away from the metal film to a display panel.

Optionally, the step of attaching a side of the adhesive layer in the metal encapsulation structure away from the metal film to a display panel comprises:

providing the metal encapsulation structure as described, wherein a protective film is attached to the side of the adhesive layer in the metal encapsulation structure away from the metal film;

peeling the protective film to expose the side of the adhesive layer away from the metal film; and attaching the side of the adhesive layer away from the metal film to the display panel.

In another aspect, an embodiment of this disclosure provides a display panel which is a display panel encapsulated by the encapsulation method for a display panel described above.

In still another aspect, an embodiment of this disclosure provides a display device, comprising a display panel encapsulated by the encapsulation method described above.

BRIEF DESCRIPTION OF THE DRAWINGS

In order to illustrate the technical solutions in the embodiments of this disclosure or in the prior art more clearly, the figures required for describing the embodiments or the prior art will be simply introduced below. It is apparent that the figures described below merely relate to some embodiments of this disclosure, and other figures may be further obtained by those of ordinary skill in the art according to these figures without exerting inventive work.

DETAILED DESCRIPTION

The technical solutions in the embodiments of this disclosure will be clearly and fully described below in conjunction with the accompanying drawings in the embodiments of this disclosure. Obviously, the embodiments described are merely a part of the embodiments of this disclosure, rather than all of the embodiments. Based on the embodiments of this disclosure, all other embodiments obtained by those of ordinary skill in the art without performing inventive work belong to the scope protected by this disclosure.

It is to be noted that unless otherwise defined, all terms (including the technical and scientific terms) used in the embodiments of this disclosure have the same meaning as commonly understood by one of ordinary skilled in the art to which this disclosure belongs. It is also to be understood that those terms typically defined in dictionaries should be construed to have the meanings consistent with their meanings in the context of the related art and should not be construed with idealized or extremely formalized sense, unless explicitly defined in this way herein.

For example, the terms used in the specification and claims of this application, such as "first", "second", and the like, used in this disclosure does not represent any order, quantity, or importance, but is only used to distinguish different constituent parts. The word, such as "include", "comprise", or the like, used in this disclosure means that the element or article occurring before this word encompasses the element or article and the equivalent thereof enumerated after this word and does not exclude other elements or articles. The terms for orientations and positional relationships indicated by terms "on/above", "under/below", etc., are based on orientations or positional relationships as shown in figures. They are merely intended to facilitate the description of the technical solutions of this disclosure and simplify the description, but do not indicate or imply that indicated apparatuses or elements necessarily have specific orientations and are configured and operated in specific orientations. Therefore, they may not be understood as limit to this disclosure.

Since the practical thicknesses of the film layers such as a metal film, a silane film, and the like involved in embodiments of this disclosure are very small, the sizes of the structures and/or the thicknesses of the film layers of the accompanying drawings of the embodiments of this disclosure are all magnified for clarity and do not indicate the practical sizes and/or ratios, unless otherwise specified.

In the metal encapsulation process, it is required to peel the protective film on the surface of the adhesive film and the adhesive film is then attached onto an OLED display panel for surface encapsulation. However, a part or all of the adhesive film will be easily taken away by an upper protective film upon peeling due to the good adhesion between the protective film and the adhesive film, resulting in peeling badness. In this way, it will not only result in waste of adhesive films and metal films, but also leads to shut-down and production delay. This adversely affects the production cost and the yield rate, and the increase of throughput is restricted.

In view of this, in order to solve the problem described above, this disclosure provides a metal encapsulation structure and a production method, an encapsulation method for a display panel, and a display device.

Figure 1:
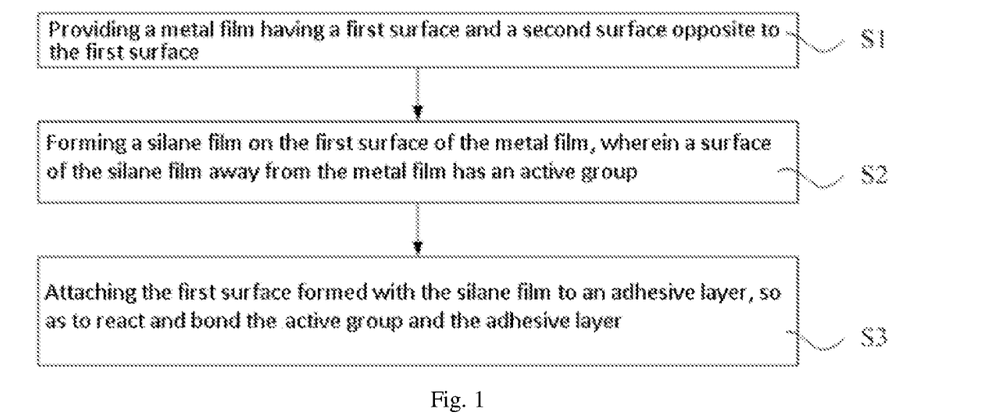
FIG. 1 shows a schematic diagram of a process flow of a production method for a metal encapsulation structure provided in an embodiment of this disclosure.

Particularly, as shown in FIG. 1, one aspect of this disclosure provides a production method for a metal encapsulation structure, comprising steps of:

Step S1: providing a metal film having a first surface and a second surface opposite to the first surface;

Step S2: forming a silane film on the first surface of the metal film, wherein a surface of the silane film away from the metal film has an active group;

Step S3: attaching the first surface formed with the silane film to an adhesive layer, so as to react and bond the active group and the adhesive layer.

It is to be indicated that the specific materials of the metal film and the adhesive layer described above may employ the conventional materials in metal encapsulation processes in the prior art.

Here, since the metal encapsulation structure described above is particularly used in the surface encapsulation of a display substrate, in view of the base substrate of the display substrate typically composed of a glass material, a material having a thermal expansion coefficient close to that of the glass material should be selected and used as the material of which the metal film is composed, in order to improve the sealing degree upon the heat pressing encapsulation of the metal encapsulation structure formed and the display panel. An iron-nickel alloy may be exemplarily used as the material of which the metal film is composed, wherein the iron-nickel alloy comprises 35% to 45% of nickel based on the total mass of the iron-nickel alloy, so as to prevent the occurrence of warping deformation of the whole display device due to the relatively significant difference between the thermal expansion coefficients of the metal film and the base substrate of the display substrate, the impact on subsequent processes, and the impact on the encapsulation effect and the product quality.

The material of the adhesive layer used in the metal encapsulation process may be an acrylate-based adhesive material, an epoxy resin-based adhesive material, and the like. After pre-polymerization of such a polymer, the polymerization degree is in a relatively low state, i.e., a large quantity of active groups still do not react. These active groups are in a resting state when preserved in a low-temperature state, and may be cured by polymerization reaction after the temperature is suitable.

The silane film formed on the first surface of the metal film described above is obtained by hydrolysis of a silane coupling agent to form a silane hydrolysate and reacting the silane hydrolysate with a hydroxy group on the first surface to generate a covalent bond having a very strong bonding force, and the silane film may be allowed to be firmly attached onto the first surface of the metal film. The surface of the silane film away from the metal film may be designed to have an active group, which may react with the large quantity of the active groups in the adhesive layer in a resting state to generate a covalent bond. The silane film located between the first surface of the metal film and the adhesive layer corresponds to a connecting layer for connecting both of them, which can significantly improve the adhesion between the metal film and the adhesive layer and prevent a part or all of the adhesive layer from being taken away when the protective film on the surface of the adhesive layer is peeled.

Here, the active group on the surface of the silane film may be exemplarily an ethylenically unsaturated group such as a vinyl group, an amino group, and/or an epoxy group, which can react with an active group in an acrylate-based adhesive material or an epoxy resin-based adhesive material to generate a covalent bond.

Figure 2:
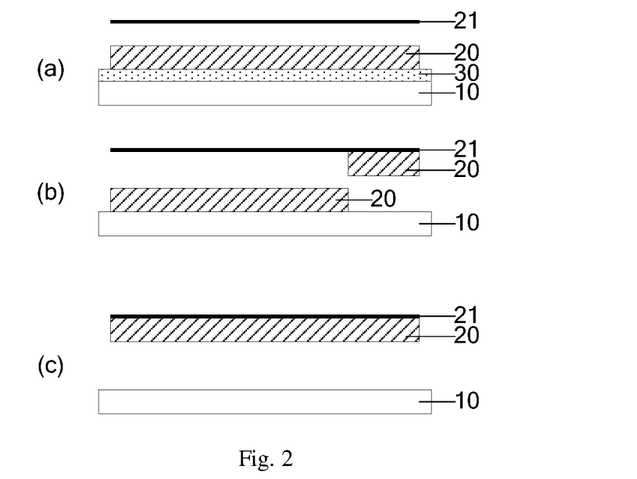
FIG. 2 shows three cases occurring when a protective film on a surface of an adhesive layer is peeled.

In this way, as shown in FIG. 2, since there is a silane film 30 acting as a connecting layer between the above metal film 10 and the adhesive layer 20 provided in one aspect of this disclosure, the adhesive layer 20 and the silane film 30 are firmly bonded and the protective film 21 may be completely peeled from the surface of the adhesive layer 20 when peeling the protective film 21 on the surface of the adhesive layer 20, i.e., a good product as shown in part (a) of FIG. 2 is formed. The case that a part of the adhesive layer 20 is taken away by the protective film 21 due to the absence of the silane film 30, i.e., the NG1 (No Good) badness as shown in part (b) of FIG. 2, will be avoided. The case that all of the adhesive layer 20 is taken away by the protective film 21, i.e., the NG2 badness as shown in part (c) of FIG. 2, will be avoided, either.

On this basis, a layer of silane film is produced on the first surface of the metal film by the above production method provided in one aspect of this disclosure using a metal film surface silanization process. Silane in the silane film reacts with a hydroxy group on the first surface of the metal film to generate a covalent bond having a very strong bonding force, and additionally, the reactive organic group in the silane is bonded to a reactive group in the adhesive layer to generate a covalent bond. This significantly improves the adhesion between the metal film and the adhesive layer and prevents a part or the whole of the adhesive layer from being taken away when the protective film on the adhesive layer is peeled. Therefore, the products with peeling badness can be prevented, which reduces the production cost and improves the yield rate of production.

On the above basis, further optionally, the step S2 described above comprises: forming a silane film on each of the first surface and the second surface of the metal film.

That is, in addition to the silane film formed on the first surface of the metal film laminated with the adhesive layer, a silane film is further formed on the opposite second surface of the metal film and is used as a protective layer, and the corrosion resistance of the metal film may be enhanced.

In this way, the occurrence of rust corrosion on the surface of the metal film may be effectively prevented in the processes of transportation and storage of the metal film as well as during the application after the display panel is subjected to surface encapsulation to produce a complete machine. Therefore, the service life of the metal film is elongated, and the overall properties of the display device after encapsulation are in turn improved.

On the above basis, a surface of the silane film away from the metal film may further have a hydrophobic group.

Here, the silane film described above may be a silane film formed on the first surface and/or the second surface of the metal film.

A conventional group in current chemical engineering design may be used as the hydrophobic group, which may be exemplarily one or more selected from a group consisting of an alkyl group having 10-20 carbon atoms, a perfluoroalkyl group having 10-20 carbon atoms, a phenyl group, an acyloxy group, and a polyoxypropylene group, and the like. The moisture barrier property of the metal encapsulation structure described above is improved by using the hydrophobic group on the surface of the silane film so as to further improve the encapsulation property of the product.

Specifically, when the step S2 described above is forming a silane film only on the first surface of the metal film, the step specifically comprises the following sub-steps:

Step (1-1): pre-treating the first surface of the metal film to form a hydroxy group on the first surface;

Step (1-2): coating a silane hydrolysate on the pre-treated first surface; and

Step (1-3): drying the first surface to react the silane hydrolysate with the hydroxy group on the first surface to generate the silane film attached to the first surface.

It is to be indicated that the object of the step (1-1) described above is to expose the metal bonds on the first surface by performing treatment on the first surface of the metal film so as to facilitate formation of sufficient hydroxy groups on the first surface, thereby achieving an object of functional modification by metal surface hydroxylation.

The silane hydrolysate used in the step (1-2) described above is formed by the hydrolysis of a silane coupling agent.

The silane coupling agent has a general structural formula of X—Si(OR)₃, wherein—R is an alkyl group having at least 1 carbon atom; and X represents an active group, which is one or more selected from a group consisting of an ethylenically unsaturated group, an amino group, and an epoxy group. The —OR group in the silane coupling agent is subjected to hydrolysis to form a silylhydroxy group (Si—OH), and silylhydroxy groups (Si—OH) between different silane molecules are subjected to dehydration condensation to form an oligosiloxane containing Si—OH. Specific examples of the silane coupling agent include one or more of 3-(2,3-epoxypropoxy)propyltriethoxysilane (Chenguang Chemical Co., Ltd.), chloropropyltrimethoxysilane (Chenguang Chemical Co., Ltd.), 1H,1H,2H,2H-perfluorodecanyltrimethoxysilane (Chenguang Chemical Co., Ltd.), hexadecyltrimethoxysilane (Nanjing Chengong Organosilicon Co., Ltd.), biphenyldimethoxysilane (Nanjing Chengong Organosilicon Co., Ltd.), and γ-methacryloyloxypropyltrimethoxysilane (Nanjing Xiangqian Chemical Co., Ltd.), and the like.

Figure 3:
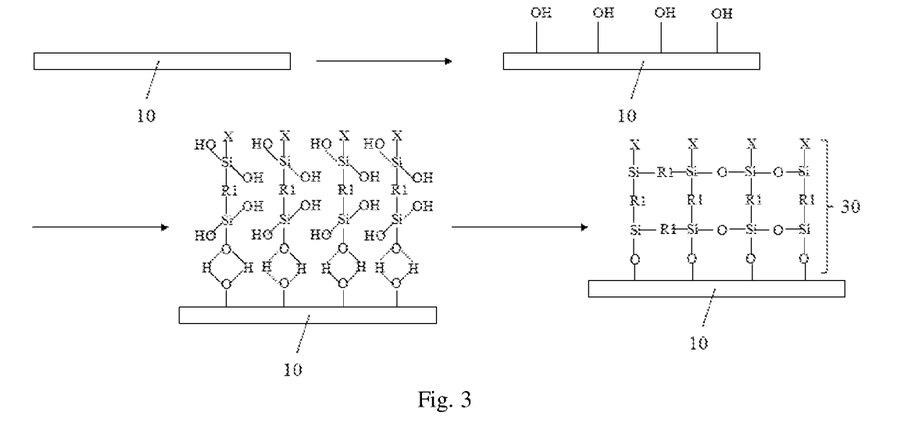
FIG. 3 shows a schematic view of the film-forming mechanism of a silane film on a metal surface.

As shown in FIG. 3, the process of forming the silane film 30 on the first surface of the metal film 10 mainly comprises a two-step reaction.

wherein, a hydrogen bond is formed between the silylhydroxy group in the oligomer and the hydroxy group (exhibiting to be alkaline, and typically referred to as an alkaline hydroxy group) on the surface of the metal film.

The first surface of the metal film 10 is pretreated and attached with a silane hydrolysate, and is cured by heating to allow the dehydration condensation of the oligomer to form a covalent bond with a hydroxy group of the first surface of the metal film 10. Typically, only one silylhydroxy group (Si—OH) in each silane molecule is bonded to a hydroxy group on the first surface of the metal film, and the remaining two silylhydroxy groups (Si—OH) are either subjected to a dehydration condensation reaction with a silylhydroxy group (Si—OH) in another silane or in a free state so as to form a silane film 30 having a reticular structure on the first surface of the metal film 10.

Figure 4:
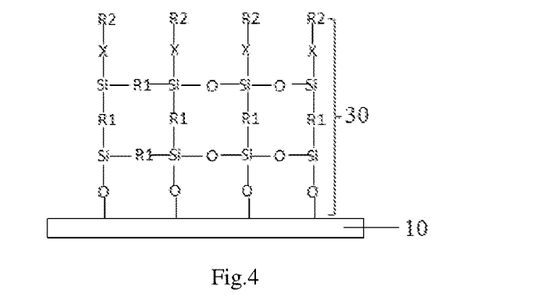
FIG. 4 shows a first schematic principle diagram wherein an active group on the surface of a silane film and an active group on an adhesive layer are bonded by a reaction.

Here, as shown in FIG. 4, in the above silane film 30 formed, —X is a reactive organic group which may react with an active group in the adhesive layer to generate a covalent bond. Particularly, it may be a group having a double bond, such as CH₂=CH-(vinyl); or may be a group having an epoxy group, such as —CH(O)CH—. These active groups may react with an active group in an adhesive material or a coating to generate a covalent bond so as to significantly enhance the adhesion between the adhesive material or the coating and the metal film 10.

Here, R1 is an alkyl group on a silane coupling agent, and R2 is an active group on an adhesive layer.

Figure 5:
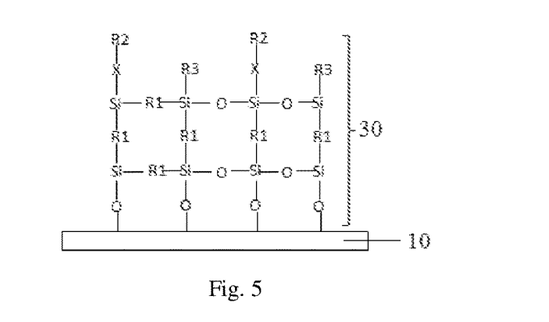
FIG. 5 shows a second schematic principle diagram wherein an active group on the surface of a silane film and an active group on an adhesive layer are bonded by a reaction.

Otherwise, as shown in FIG. 5, the surface of the above formed silane film 30 away from the metal film 10 may further have a hydrophobic group (marked as R3 in the figure), and thereby the moisture barrier property of the metal encapsulation structure described above is improved so as to further improve the encapsulation property of the product. The hydrophobic group is one or more selected from a group consisting of an alkyl group having 10-20 carbon atoms, a perfluoroalkyl group having 10-20 carbon atoms, a phenyl group, an acyloxy group, and a polyoxypropylene group.

A conventional coupling agent material used in metal surface silanization treatment in the prior art may be used as the silane coupling agent. This is not limited in the examples of this disclosure.

When the step S2 described above comprises forming a silane film on each of the first surface and the second surface of the metal film, the step specifically comprises the following sub-steps:

Step S(2-1): pre-treating each of the first surface and the second surface of the metal film to form a hydroxy group on each of the first surface and the second surface;

Step S(2-2): impregnating the metal film in a silane hydrolysate to attach the silane hydrolysate to each of the first surface and the second surface of the metal film; and Step S(2-3): drying each of the first surface and the second surface to react the silane hydrolysate with hydroxy groups on each of the first surface and the second surface to generate silane films attached to the first surface and the second surface.

The film-forming principle of the silane film on the second surface of the metal film can be seen in the description for step (1-1) to step (1-3) described above. Verbose words are omitted herein.

Further, the step S(1-1) or step S(2-1) described above further specifically comprise the following sub-steps:

Step a: washing the first surface and the second surface of the metal film to remove residual contaminants;

Step b: soaking the metal film in an alkaline solution to form a hydroxy group on each of the first surface and the second surface; and Step c: withdrawing the metal film and washing the metal film with deionized water to remove the alkaline solution remaining on the first surface and the second surface.

It is to be indicated that the contaminants such as greases, dusts, oxides (i.e., rust), scales on the surface of the metal film needs to be thoroughly removed when pretreatment is performed thereon to allow the surface of the metal film after treatment to have a good wettability, which is favorable to the complete bonding between the metal film and silane molecules. If a residue is present on the surface of the metal film, the bonding between the silane molecules and the surface of the metal film will be impacted by the residue, resulting in uneven film-forming of the silane film and even no film-forming in some parts.

The metal film is soaked in an alkaline solution to allow a hydroxy group to be present on each of the first surface and the second surface. The alkaline solution used for alkali washing may be exemplarily a NaOH solution having a certain concentration. The pH value thereof should be flexibly adjusted according to the degree of difficulty in hydroxylation on the surface of the metal film, and may be exemplarily selected to be pH=12.

Another aspect of this disclosure provides a metal encapsulation structure formed by the production method in the first aspect of this disclosure, comprising: a metal film having a first surface and a second surface opposite to the first surface; a silane film provided on the first surface; and an adhesive layer laminated on the first surface attached with the silane film.

In this way, the silane film provided on the first surface of the metal film described above is bonded to the surface of the metal film by a covalent bond, and the silane film may be allowed to be firmly attached to the first surface of the metal film. The surface of the silane film away from the metal film is designed to have an active group, which reacts with the large quantity of the active groups in the adhesive layer in a resting state to generate a covalent bond. The silane film located between the first surface of the metal film and the adhesive layer corresponds to a bridge for connecting both of them, which can significantly improve the adhesion between the metal film and the adhesive layer and prevent a part or all of the adhesive layer from being taken away when the protective film on the surface of the adhesive layer is peeled.

Further, the silane film described above is further provided on the second surface, i.e., overcoats the whole metal film, so as to be used as a protective layer which is used to enhance the corrosion resistance of the metal film.

Further, with reference to those as shown in FIG. 5, the surface of the silane film 30 described above away from the metal film 10 further comprises a hydrophobic group. A conventional group in the current chemical engineering design may be used as the hydrophobic group, and may be exemplarily one or more selected from a group consisting of an alkyl group having 10-20 carbon atoms, a perfluoroalkyl group having 10-20 carbon atoms, a phenyl group, an acyloxy group, a polyoxypropylene group, and the like. The moisture barrier property of the metal encapsulation structure described above is improved by using the hydrophobic group on the surface of the silane film 30 so as to further improve the encapsulation property of the product.

Here, the adhesive layer may be composed of an acrylate and/or an epoxy resin, and the metal film may be composed of an iron-nickel alloy, wherein the content of nickel is 35% to 45% of the total mass.

Yet another aspect of this disclosure provides an encapsulation method for a display panel, comprising steps of: providing a metal encapsulation structure according to another aspect of this disclosure described above; and attaching a side of the adhesive layer in the metal encapsulation structure away from the metal film to a display panel.

The encapsulation method described above specifically comprises steps of: peeling the protective film laminated on a side of the adhesive layer in the metal encapsulation structure away from the metal film to expose the side of the adhesive layer away from the metal film; and attaching the side of the adhesive layer away from the metal film to a display panel.

Figure 6:
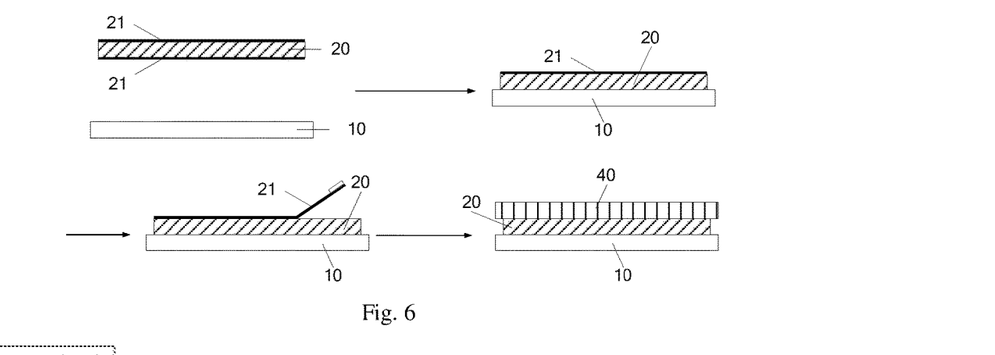
FIG. 6 shows a schematic diagram of a process flow of a specific encapsulation process provided in an embodiment of this disclosure.

As shown in FIG. 6, the specific encapsulation process comprises steps of: peeling the protective film 21 below the adhesive layer 20 and attaching the adhesive layer 20 to the first surface of the metal film 10 formed with the silane film by a heat pressing process; and peeling the protective film 21 (i.e., an upper protective film) on a side of the adhesive layer 20 away from the metal film 10 in a laminator apparatus and attaching the adhesive layer 20 onto a surface of a display panel 40 away from the light emergent side, and performing a surface encapsulation process on the display panel by processes of film coating, heat pressing, and curing, sequentially.

Another aspect this disclosure provides a display panel which is a display panel encapsulated by the encapsulation method for a display panel described above.

Still another aspect of this disclosure provides a display device, comprising: the display panel described above encapsulated by using the encapsulation method according to yet another aspect of this disclosure. This display device is specifically an OLED display device, and may be a product or member with any display function, such as an OLED display, an OLED television, a digital photo frame, a cell phone, a tablet computer, a navigator, and the like.

Three specific Examples are provided below to describe the processes of the production of the metal encapsulation structure and the encapsulation laminated on a display panel in detail.

Example 1

Figure 7:
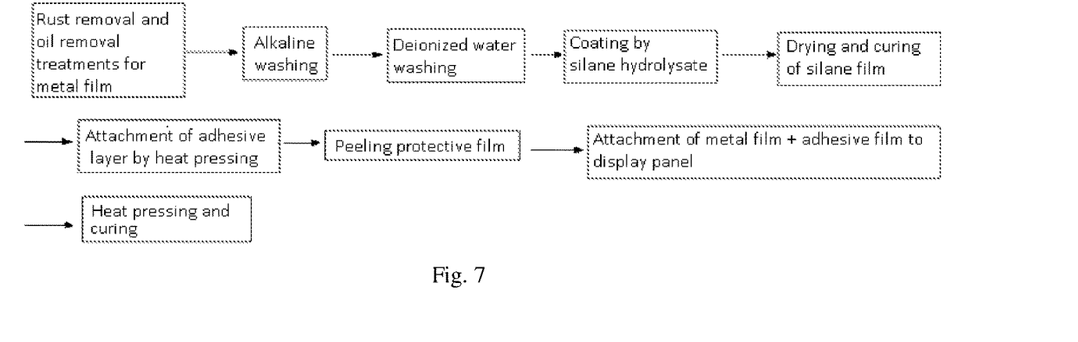
FIG. 7 shows a schematic diagram of an overall process flow for the encapsulation of a display panel and the production of a metal encapsulation structure provided in an embodiment of this disclosure.

As shown in FIG. 7, the processes for the production and the specific encapsulation of the metal encapsulation structure were as follows.

1. Pretreatment of a metal film: A surface of a metal film was subjected to rust removal and oil removal treatments. An aqueous NaOH solution with a concentration of 20 g/L was formulated as an alkaline solution. The metal film was placed and soaked in the alkaline solution. After soaking, the alkaline solution remaining on the surface of the metal film was washed off with deionized water.

2. Formulation of a silane hydrolysate: 50 g of a silane coupling agent, that is, 3-(2,3-epoxypropoxy) propyltriethoxysilane, was added to 1 L of a mixed liquid of propanol and deionized water containing 0.55 L of propanol, and then an aqueous acetic acid solution or an aqueous NaOH solution was added with stirring to adjust the pH value to be 4.5 to 6.5, and the stirring was continued until the solution exhibited to be a uniform transparent liquid to achieve a silane hydrolysate.

Here, by controlling the pH value of the solution to be 4.5 to 6.5 (for example about 5.5), it was favorable to the formation of a uniform solution, and the silane coupling agent had a good solubility in this pH range.

3. The surface silanization of the metal film: The silane hydrolysate was uniformly coated on the first surface of the metal film to which an adhesive film was attached and baked at a certain temperature, the first step and the second step described above of the silanization reaction on the surface of the metal film were sequentially performed, and water generated in the polycondensation reaction of silane was dried. The silane film obtained had a thickness of 10 micrometers.

4. Attachment of an adhesive layer: A protective film on a side of an adhesive layer is peeled, and a side of the adhesive layer with the protective film peeled was attached to the first surface of the metal film on a heat pressing film coater. In this process, an active group on the surface of the silane film reacted with an active group on the surface of the adhesive layer to form a covalent bond. Therefore, the adhesion between the adhesive layer and the metal film may be significantly improved.

Figure 8:
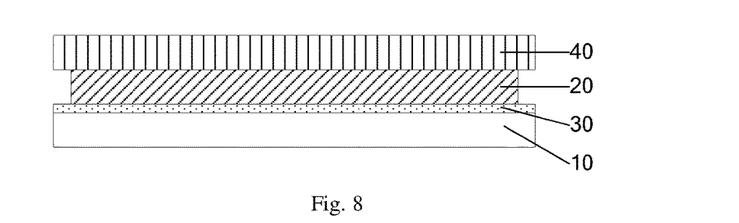
FIG. 8 shows a structural schematic diagram of a display panel provided in an embodiment of this disclosure after surface encapsulation is performed with a metal encapsulation structure.

5. Lamination with a display panel: The metal film+adhesive film after film coating were transferred to a laminator apparatus, and attached to a preheated display panel after the protective film thereof was peeled. Thereafter, the display panel was transferred to a heat pressing apparatus, and the adhesive layer was completely cured by heat pressing to form the encapsulated display panel as shown in FIG. 8.

Here, the display panel was preheated for the purpose of increasing the adhesion, and the preheating temperature was in a low-temperature range of 40 to 50° C. to prevent the light emission efficiency of the OLED device in the display panel from being impacted by preheating at a high temperature.

In this Example 1, the adhesion between the surface of the metal film and the adhesive layer may be significantly improved to prevent the case that a part or all of the adhesive layer is taken away by the protective film. The effects of improving the yield rate and the throughput and reducing the production cost may be achieved.

Example 2

Figure 9:
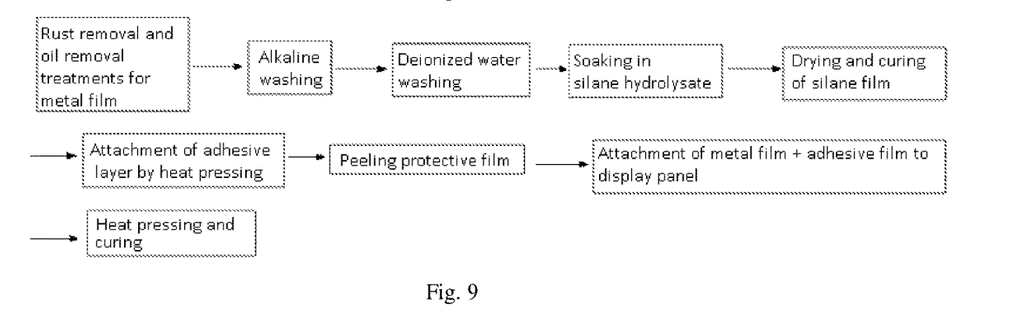
FIG. 9 shows a schematic diagram of an overall process flow for the encapsulation of a display panel and the production of a metal encapsulation structure provided in another embodiment of this disclosure.

As shown in FIG. 9, the processes for the production and the specific encapsulation of the metal encapsulation structure were as follows.

1. Pretreatment of a metal film: A surface of a metal film was subjected to rust removal and oil removal treatments. An aqueous NaOH solution with a concentration of 20 g/L was formulated as an alkaline solution. The metal film was placed and soaked in the alkaline solution. After soaking, the alkaline solution remaining on the surface of the metal film was washed off with deionized water.

2. Formulation of a silane hydrolysate: 50 g of a silane coupling agent, that is, 3-(2,3-epoxypropoxy) propyltriethoxysilane, was added to 1 L of a mixed liquid of propanol and deionized water containing 0.55 L of propanol, and then an aqueous acetic acid solution or an aqueous NaOH solution was added with stirring to adjust the pH value to be 4.5 to 6.5, and the stirring was continued until the solution exhibited to be a uniform transparent liquid to achieve a silane hydrolysate.

Here, by controlling the pH value of the solution to be 4.5 to 6.5 (for example about 5.5), it was favorable to the formation of a uniform solution, and the silane coupling agent had a good solubility in this pH range.

3. The surface silanization of the metal film: The pretreated metal film was soaked in the silane hydrolysate for a certain period, the metal film was then withdrawn and dried by baking, and the first step and the second step described above of the silanization reaction on the surface of the metal film were sequentially performed, and water generated in the polycondensation reaction of silane was dried. The silane film obtained had a thickness of 10 micrometers.

4. Attachment of an adhesive layer: A protective film on a side of an adhesive layer is peeled, and a side of the adhesive layer with the protective film peeled was attached to the first surface of the metal film on a heat pressing film coater. In this process, an active group on the surface of the silane film reacted with an active group on the surface of the adhesive layer to form a covalent bond. Therefore, the adhesion between the adhesive layer and the metal film may be significantly improved.

Figure 10:
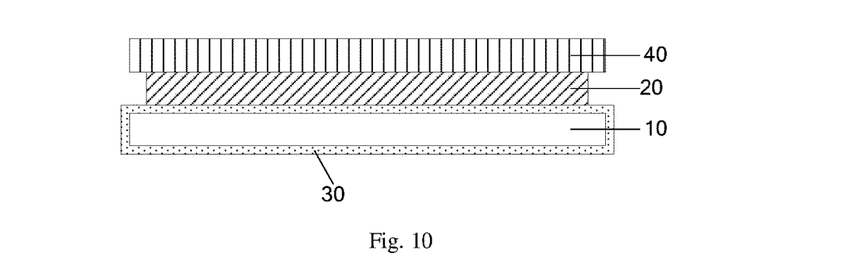
FIG. 10 shows a structural schematic diagram of a display panel provided in another embodiment of this disclosure after surface encapsulation is performed with a metal encapsulation structure.

5. Lamination with a display panel: The metal film+adhesive film after film coating were transferred to a laminator apparatus, and attached to a preheated display panel after the protective film thereof was peeled. Thereafter, the display panel was transferred to a heat pressing apparatus, and the adhesive layer was completely cured by heat pressing to form the encapsulated display panel as shown in FIG. 10.

Example 2 has all of the advantageous effects of Example 1 described above, and forms a corrosion-resistant protective film on the whole layer of the metal film. The occurrence of rust corrosion on the surface of the metal film may be effectively prevented in the processes of transportation and storage of the metal film as well as during application after the display panel is subjected to surface encapsulation to produce a complete machine. Therefore, the service life of the metal film is elongated, and the overall properties of the display device after encapsulation are in turn improved.

Example 3

1. Pretreatment of a metal film: A surface of a metal film was subjected to rust removal and oil removal treatments. An aqueous NaOH solution with a concentration of 20 g/L was formulated as an alkaline solution. The metal film was placed and soaked in the alkaline solution. After soaking, the alkaline solution remaining on the surface of the metal film was washed off with deionized water.

2. Formulation of a silane hydrolysate: 50 g of a silane coupling agent, 3-(2,3-epoxypropoxy) propyltriethoxysilane, having an active group and 20 g of a silane coupling agent, 1H, 1H, 2H, 2H-perfluorodecanyltrimethoxysilane, having a hydrophobic group were added to 1 L of a mixed liquid of propanol and deionized water containing 0.55 L of propanol to form a composite silane hydrolysate by blending. An aqueous acetic acid solution or an aqueous NaOH solution was added thereto with stirring to adjust the pH value to be 4.5 to 6.5, and the stirring was continued until the solution exhibited to be a uniform transparent liquid to achieve a silane hydrolysate. In the composite silane hydrolysate, the silane component was formed by mixing a component containing a reactive group and a component containing a hydrophobic group.

3. The surface silanization of the metal film: A process flow in Example 1 or Example 2 described above may be selected.

That is, a silane film was formed only on the first surface of the metal film by silanization treatment, or silane films were formed on both sides of the first surface and the second surface of the metal film by silanization treatment. The silane film obtained had a thickness of 10 micrometers.

4. Attachment of an adhesive layer: A protective film on a side of an adhesive layer is peeled, and a side of the adhesive layer with the protective film peeled was attached to the first surface of the metal film on a heat pressing film coater. In this process, an active group on the surface of the silane film reacted with an active group on the surface of the adhesive layer to form a covalent bond. Therefore, the adhesion between the adhesive layer and the metal film may be significantly improved.

5. Lamination with a display panel: The metal film+adhesive film after film coating were transferred to a laminator apparatus, and attached to a preheated display panel after the protective film thereof was peeled. Thereafter, the display panel was transferred to a heat pressing apparatus, and the adhesive layer was completely cured by heat pressing to form the encapsulated display panel.

Example 3 has all of the advantageous effects of Example 1 and/or Example 2, and improves the moisture barrier property of the encapsulation structure by using the hydrophobic group in the composite silane agent formulated so as to further improve encapsulation properties of the product.

The above embodiments are only specific embodiments of the disclosure, but the scope of the disclosure is not limited thereto. Within the technical scope disclosed by this disclosure, any person skilled in the art will easily conceive variations or replacements, which should be covered by the scope of the disclosure. Therefore, the protection scope of the disclosure should be determined by the protection scope of the claims.

What is claimed is:

1. A production method for a metal encapsulation structure, comprising steps of:
    providing a metal film having a first surface and a second surface opposite to the first surface;
    forming a silane film on the first surface of the metal film, wherein a surface of the silane film away from the metal film has an active group; and
    attaching the first surface formed with the silane film to an adhesive layer, so as to react and bond the active group and the adhesive layer,
    wherein:
    the step of forming a silane film on the first surface of the metal film comprises:
        pre-treating the first surface of the metal film to form a hydroxy group on the first surface;
        coating a silane hydrolysate on the pre-treated first surface; and
        drying the first surface to react the silane hydrolysate with the hydroxy group on the first surface to generate the silane film attached to the first surface; or
    the step of forming a silane film on the first surface of the metal film comprises forming a silane film on each of the first surface and the second surface of the metal film, and the step of forming the silane film on each of the first surface and the second surface of the metal film comprises:
        pre-treating each of the first surface and the second surface of the metal film to form a hydroxy group on each of the first surface and the second surface;
        impregnating the metal film in a silane hydrolysate to attach the silane hydrolysate to each of the first surface and the second surface of the metal film; and
        drying each of the first surface and the second surface to react the silane hydrolysate with hydroxy groups on each of the first surface and the second surface to generate silane films attached to the first surface and the second surface.

2. The production method for a metal encapsulation structure according to claim 1, wherein the active group is one or more selected from a group consisting of an ethylenically unsaturated group, an amino group, and an epoxy group.

3. The production method for a metal encapsulation structure according to claim 1, wherein the surface of the silane film away from the metal film further comprises a hydrophobic group.

4. The production method for a metal encapsulation structure according to claim 3, wherein the hydrophobic group is one or more selected from a group consisting of an alkyl group having 10-20 carbon atoms, a perfluoroalkyl group having 10-20 carbon atoms, a phenyl group, an acyloxy group, and a polyoxypropylene group.

5. The production method for a metal encapsulation structure according to claim 1, wherein the step of forming a silane film on the first surface of the metal film comprises: pre-treating the first surface of the metal film to form the hydroxy group on the first surface; coating the silane hydrolysate on the pre-treated first surface; and drying the first surface to react the silane hydrolysate with the hydroxy group on the first surface to generate the silane film attached to the first surface, and wherein the step of pre-treating the first surface of the metal film to form a hydroxy group on the first surface comprises:
    washing the first surface of the metal film to remove residual contaminants;
    soaking the metal film in an alkaline solution to form the hydroxy group on the first surface; and
    withdrawing the metal film and washing the metal film with deionized water to remove the alkaline solution remaining on the first surface.

6. The production method for a metal encapsulation structure according to claim 1, wherein the step of forming a silane film on the first surface of the metal film comprises forming a silane film on each of the first surface and the second surface of the metal film, and the step of forming a silane film on each of the first surface and the second surface of the metal film comprises: pre-treating each of the first surface and the second surface of the metal film to form a hydroxy group on each of the first surface and the second surface; impregnating the metal film in a silane hydrolysate to attach the silane hydrolysate to each of the first surface and the second surface of the metal film; and drying each of the first surface and the second surface to react the silane hydrolysate with hydroxy groups on each of the first surface and the second surface to generate silane films attached to the first surface and the second surface, and wherein the step of pre-treating each of the first surface and the second surface of the metal film to form a hydroxy group on each of the first surface and the second surface comprises:
    washing the first surface and the second surface of the metal film to remove residual contaminants;
    soaking the metal film in an alkaline solution to form the hydroxy group on each of the first surface and the second surface; and
    withdrawing the metal film and washing the metal film with deionized water to remove the alkaline solution remaining on the first surface and the second surface.

7. The production method for a metal encapsulation structure according to claim 5, wherein the silane hydrolysate is formed by hydrolysis of a silane coupling agent.

8. The production method for a metal encapsulation structure according to claim 1, wherein the silane film has a thickness of 1-20 micrometers.

9. The production method for a metal encapsulation structure according to claim 1, wherein the adhesive layer comprises one or more selected from a group consisting of an acrylate and an epoxy resin.

10. The production method for a metal encapsulation structure according to claim 1, wherein the metal film is composed of an iron-nickel alloy.

11. The production method for a metal encapsulation structure according to claim 10, wherein the iron-nickel alloy comprises 35% to 45% of nickel based on a total mass of the iron-nickel alloy.

12. A metal encapsulation structure, which is produced by the production method for a metal encapsulation structure according to claim 1.

13. An encapsulation method for a display panel, comprising steps of:
providing a metal film having a first surface and a second surface opposite to the first surface;
forming a silane film on the first surface of the metal film, wherein a surface of the silane film away from the metal film has an active group;
attaching the first surface formed with the silane film to an adhesive layer, so as to react and bond the active group and the adhesive layer, thereby obtaining a metal encapsulation structure; and
attaching a side of the adhesive layer in the metal encapsulation structure away from the metal film to the display panel,
wherein:
the step of forming a silane film on the first surface of the metal film comprises:
pre-treating the first surface of the metal film to form a hydroxy group on the first surface;
coating a silane hydrolysate on the pre-treated first surface; and
drying the first surface to react the silane hydrolysate with the hydroxy group on the first surface to generate the silane film attached to the first surface; or
the step of forming a silane film on the first surface of the metal film comprises forming a silane film on each of the first surface and the second surface of the metal film, and the step of forming a silane film on each of the first surface and the second surface of the metal film comprises:
pre-treating each of the first surface and the second surface of the metal film to form a hydroxy group on each of the first surface and the second surface;
impregnating the metal film in a silane hydrolysate to attach the silane hydrolysate to each of the first surface and the second surface of the metal film; and
drying each of the first surface and the second surface to react the silane hydrolysate with hydroxy groups on each of the first surface and the second surface to generate silane films attached to the first surface and the second surface.

14. The encapsulation method for a display panel according to claim 13, wherein the step of attaching a side of the adhesive layer in the metal encapsulation structure away from the metal film to a display panel comprises:
providing the metal encapsulation structure, wherein a protective film is attached to the side of the adhesive layer in the metal encapsulation structure away from the metal film;
peeling the protective film to expose the side of the adhesive layer away from the metal film; and
attaching the side of the adhesive layer away from the metal film to the display panel.

15. A display panel, which is encapsulated by the encapsulation method for a display panel according to claim 13.

16. A display device, comprising the display panel of claim 15.

17. A display panel, which is encapsulated by the encapsulation method for a display panel according to claim 14.

* * * * *